(12) United States Patent
Ikemoto

(10) Patent No.: US 11,433,928 B2
(45) Date of Patent: Sep. 6, 2022

(54) UNDERFLOOR DEVICE FOR RAILWAY VEHICLE

(71) Applicant: Mitsubishi Electric Corporation, Tokyo (JP)

(72) Inventor: Minoru Ikemoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 339 days.

(21) Appl. No.: 16/757,513

(22) PCT Filed: Oct. 27, 2017

(86) PCT No.: PCT/JP2017/038922
§ 371 (c)(1),
(2) Date: Apr. 20, 2020

(87) PCT Pub. No.: WO2019/082382
PCT Pub. Date: May 2, 2019

(65) Prior Publication Data
US 2021/0188331 A1 Jun. 24, 2021

(51) Int. Cl.
*B61G 5/00* (2006.01)
*H02G 3/00* (2006.01)
(Continued)

(52) U.S. Cl.
CPC .............. *B61G 5/10* (2013.01); *H02G 3/36* (2013.01); *H05K 5/0217* (2013.01); *H05K 5/0247* (2013.01); *B61C 3/00* (2013.01)

(58) Field of Classification Search
None
See application file for complete search history.

(56) References Cited

U.S. PATENT DOCUMENTS 9,694,689 B2* 7/2017 Yamasaki ............. B60L 15/007
9,812,850 B2* 11/2017 Kiyota ................ B60R 16/0238
(Continued)

FOREIGN PATENT DOCUMENTS

CN 101448669 A 6/2009
CN 102574535 A 7/2012
(Continued)

OTHER PUBLICATIONS

Office Action dated Mar. 31, 2021, in corresponding India Patent Application No. 202027016029, including an English translation of the Office Action. (6 pages).
(Continued)

*Primary Examiner* — Courtney L Smith
(74) *Attorney, Agent, or Firm* — Buchanan Ingersoll & Rooney PC

(57) ABSTRACT

An underfloor device includes first and second closed portions. The outer surfaces of the first and second closed portions form a portion of a housing. A portion of the outer surfaces of the first and second closed portions are in contact with an open portion that is a space extending into a vertical direction from an opening formed on the vertically top face of the housing. The portion of the outer surface of the first closed portion in contact with the open portion and the portion of the outer portion of the second closed portion in contact with the open portion are provided with a first connection port and a second connection port, respectively. A first outfitting cable and a second outfitting cable are to be passed through the opening and the open portion, and respectively through the first connection port and the second connection port.

20 Claims, 6 Drawing Sheets

(51) Int. Cl.
  *B61G 5/10* (2006.01)
  *H02G 3/36* (2006.01)
  *H05K 5/02* (2006.01)
  *B61C 3/00* (2006.01)

(56) References Cited

U.S. PATENT DOCUMENTS

| | | | | |
|---|---|---|---|---|
| 10,499,514 | B2* | 12/2019 | Miyamoto | H05K 7/20918 |
| 11,173,790 | B2* | 11/2021 | Yokoyama | B60L 13/006 |
| 2009/0101419 | A1 | 4/2009 | Okayama et al. | |
| 2009/0240384 | A1* | 9/2009 | Ikemoto | B60L 1/003 701/1 |
| 2012/0181391 | A1 | 7/2012 | Detterbeck et al. | |
| 2015/0357799 | A1* | 12/2015 | Nakashima | H02B 1/48 361/622 |
| 2019/0255951 | A1* | 8/2019 | Yokoyama | B60L 13/006 |

FOREIGN PATENT DOCUMENTS

| | | |
|---|---|---|
| JP | S62299474 A | 12/1987 |
| JP | 2000211504 A | 8/2000 |
| JP | 2001095101 A | 4/2001 |
| WO | 2007/138645 A1 | 12/2007 |

OTHER PUBLICATIONS

International Search Report (with English Translation) and Written Opinion issued in corresponding International Patent Application No. PCT/JP2017/038922, 6 pages (dated Jan. 16, 2018).
Notification of Reasons for Rejection (with English Translation) issued in corresponding Japanese Patent Application No. 2019-549967, 6 pages (dated Apr. 7, 2020).

\* cited by examiner

UNDERFLOOR DEVICE FOR RAILWAY VEHICLE

TECHNICAL FIELD

The present disclosure relates to a railway vehicle underfloor device to be mounted under a floor of a railway vehicle.

BACKGROUND ART

A railway vehicle underfloor device is attached to a railway vehicle at a location under the floor thereof. In a railway vehicle control device disclosed in Patent Literature 1, joining portions are provided to longitudinal casings on a central position in the vehicle width. The joining portions of the two longitudinal casings are faced toward each other and then the longitudinal casings are joined, thereby forming an integrated case. In the vehicle control device disclosed in Patent Literature 1, covering a space between the longitudinal casings with a flat ceiling cover and a flat floor cover forms a wire duct. Wiring is passed through the wire duct and is connected to each of the two longitudinal casings.

CITATION LIST

Patent Literature

Patent Literature 1: Unexamined Japanese Patent Application Kokai Publication No. 2000-211504

SUMMARY OF INVENTION

Technical Problem

In the railway vehicle control device disclosed in Patent Literature 1, it is necessary to lay wiring inside a duct from the duct lead-in entrance to the longitudinal casings and the task of laying this wiring is troublesome. As described in Patent Literature 1, in a case where connection ports for the wiring is arranged in a row in the widthwise direction of the vehicle in the duct lead-in entrance, the greater the number of the connection ports, the greater the length of the railway vehicle control device in the widthwise direction.

In consideration of the foregoing circumstances, an objective of the present disclosure is to simplify the installation process while suppressing an increase in size of a railway vehicle underfloor device.

Solution to Problem

In order to achieve the foregoing objective, a railway vehicle underfloor device of the present disclosure to be mounted under a floor of a railway vehicle includes a housing, a first closed portion, and a second closed portion. An opening is provided on at least a top face of the housing in a vertical direction. An open portion that is a space extending in the vertical direction from the opening is provided inside the housing. An outer surface of the first closed portion forms a portion of the housing. A portion of the outer surface of the first closed portion is in contact with the open portion. A first connection port through which a first outfitting cable that electrically connects to an electronic component to be housed inside the first closed portion is to be passed is provided on the outer surface in contact with the open portion. The outer surface of the second closed portion forms a portion of the housing. A portion of the outer surface of the second closed portion is in contact with the open portion. A second connection port through which a second outfitting cable that electrically connects to an electronic component to be housed inside the second closed portion is to be passed is provided on the outer surface in contact with the open portion. The first outfitting cable and the second outfitting cable are passed through the opening and the open portion, and respectively through the first connection port and the second connection port.

Advantageous Effects of Invention

The present disclosure can simplify an outfitting process while suppressing an increase in the size of the underfloor device by passing the first outfitting cable and the second outfitting cable through the opening provided on at least the top face of the housing in the vertical direction and the open portion that is the space extending in the vertical direction from the opening and being provided inside the housing, and respectively through the first connection port of the first closed portion and the second connection port of the second closed portion.

DESCRIPTION OF EMBODIMENTS

Figure 1:
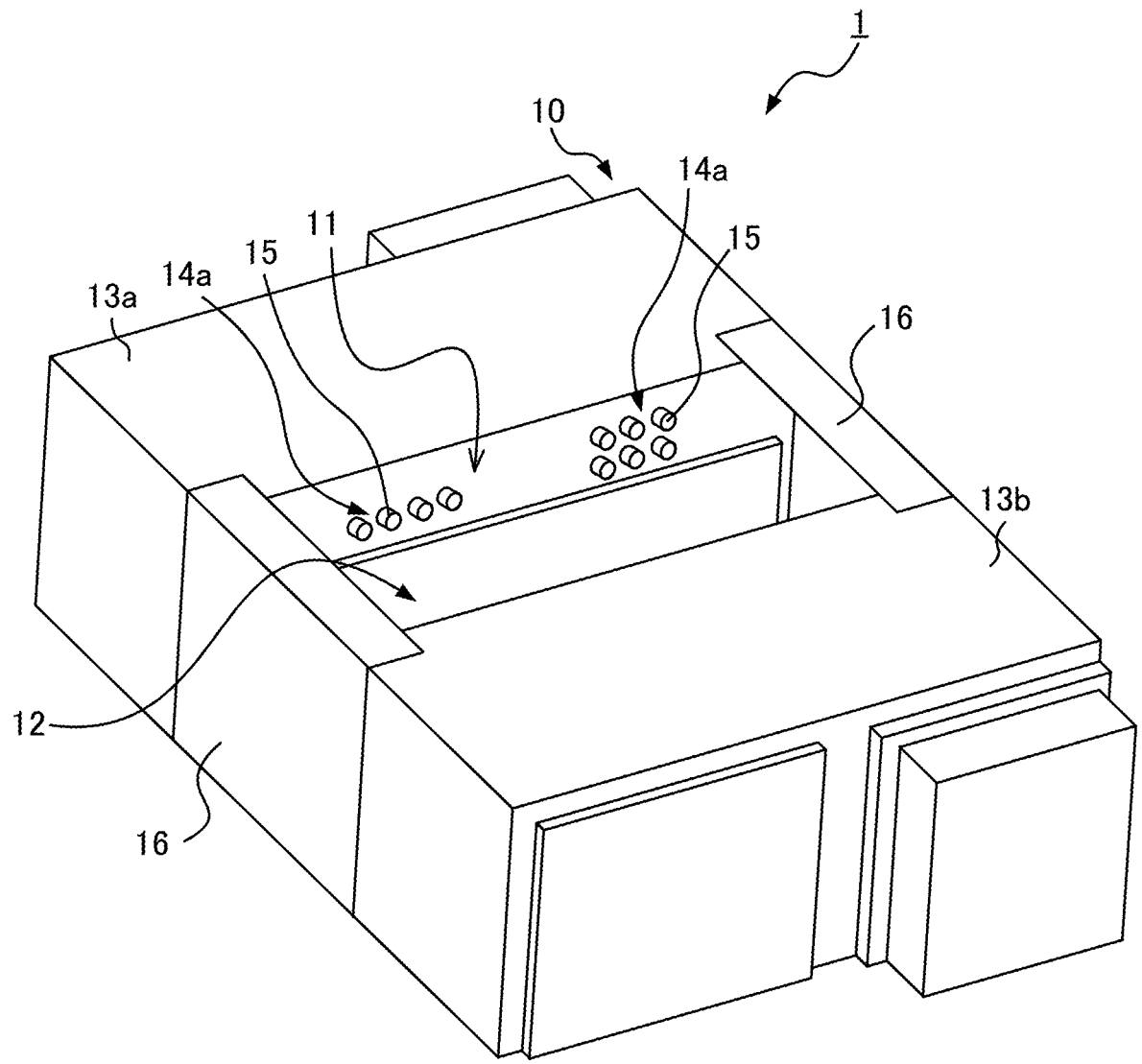
FIG. 1 is a perspective view of a railway vehicle underfloor device according to Embodiment 1 of the present disclosure.

The embodiments of the present disclosure are described below in detail with reference to the drawings. In the drawings, components that are the same or equivalent are assigned the same reference signs.

Embodiment 1

Figure 2:
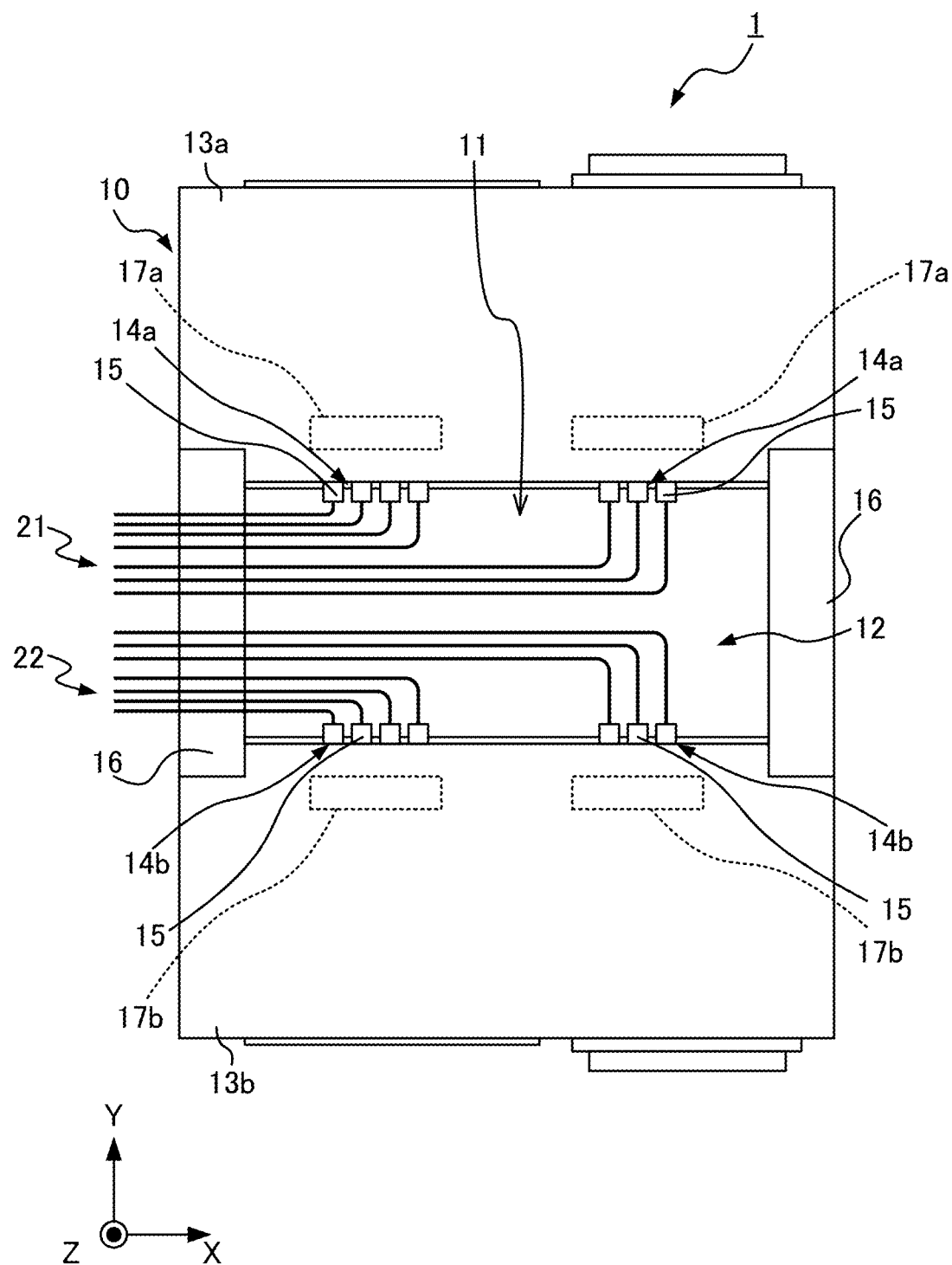
FIG. 2 is a plan view of the railway vehicle underfloor device according to Embodiment 1.

FIG. 1 is a perspective view of a railway vehicle underfloor device according to Embodiment 1 of the present disclosure. FIG. 2 is a plan view of the railway vehicle underfloor device according to Embodiment 1. A railway vehicle underfloor device (hereinafter referred to as underfloor device) 1 is mounted under the floor of an electric railway vehicle, for example. The underfloor device 1 is attached to the railway vehicle at a location under the floor of the railway vehicle by a non-illustrated metal hanging hook. In FIG. 1 and FIG. 2, the X-axis direction is the travel direction or the forward/backward direction. The Z-axis direction is the vertical direction or the upward/downward direction. The Y-axis direction is a direction perpendicular to the X-axis and the Y-axis and is a widthwise direction or a lateral direction. In a housing 10 of the underfloor device 1, an opening 11 is provided on at least a top face of the housing 10 in the Z-axis direction. Inside the housing 10, an open portion 12 that is a space extending in the Z-axis direction from the opening 11 is provided.

The underfloor device 1 includes a first closed portion 13a and a second closed portion 13b. The outer surface of the first closed portion 13a forms a portion of the housing 10. A portion of the outer surface of the first closed portion 13a is in contact with the open portion 12. Electronic components are to be housed inside the first closed portion 13a On the portion of the outer surface of the first closed portion 13a in contact with the open portion 12, a first connection port 14a is provided through which a first outfitting cable 21 that electrically connects to a corresponding electronic component of the electronic components to be housed inside is to be passed. Likewise, the outer surface of the second closed portion 13b forms a portion of the housing 10. A portion of the outer surface of the second closed portion 13b is in contact with the open portion 12. Electronic components are housed inside the second closed portion 13b. On the portion of the outer surface of the second closed portion 13b in contact with the open portion 12, a second connection port 14b is provided through which a second outfitting cable 22 that electrically connects to a corresponding electronic component of the electronic components to be housed inside is to be passed. Air, moisture, dust, and the like from the exterior do not flow into the first closed portion 13a and the second closed portion 13b.

The first outfitting cable 21 is passed through the opening 11 and the open portion 12, and respectively through the first connection port 14a and the second connection port 14b. The first connection port 14a and the second connection port 14b each include a waterproof metal fitting 15 that is waterproof cable gland. By including the waterproof metal fitting 15, air, moisture, dust, and the like from the exterior can be suppressed or prevented from entering the first closed portion 13a and the second closed portion 13b via the first connection port 14a and the second connection port 14b, respectively. By inserting the first outfitting cable 21 and the second outfitting cable 22 through the respective waterproof metal fittings 15, the first outfitting cable 21 and the second outfitting cable 22 are passed through the first connection port 14a and the second connection port 14b, respectively. The structure and the shape of the first connection port 14a and the second connection port 14b are not limited to those in the foregoing example.

In the example of Embodiment 1, the first outfitting cable 21 electrically connects to a corresponding electronic component of the electronic components housed inside the first closed portion 13a via a terminal block 17a housed inside the first closed portion 13a. The terminal block 17a is provided in parallel to the first connection port 14a inside the first closed portion 13a. Likewise, the second outfitting cable 22 electrically connects to a corresponding electronic component of the electronic components housed inside the second closed portion 13b via a terminal block 17b housed inside the second closed portion 13b. The terminal block 17b is provided in parallel to the second connection port 14b inside the second closed portion 13b.

In the example of Embodiment 1, the first closed portion 13a and the second closed portion 13b are arranged across the open portion 12 in the Y-axis direction, such that the first connection port 14a and the second connection port 14b face each other. In the example of FIG. 1 and FIG. 2, the underfloor device 1 is equipped with a pair of fixing members 16 extending in the Y-axis direction. This pair of fixing members 16 holds the first closed portion 13a and the second closed portion 13b, with a gap therebetween in the Y-axis direction. The housing 10 is formed by the outer surface of the first closed portion 13a, the outer surface of the second closed portion 13b and the fixing members 16.

In the example of Embodiment 1, an increase in the size of the underfloor device 1 in the Y-axis direction can be prevented because the first connection port 14a and the second connection port 14b are arranged in the X-axis direction. Moreover, the outfitting process is simplified as performing outfitting process by crawling under the underfloor device 1 in the Z-axis direction is unnecessary because the opening 11 is provided on the top face in the Z-axis direction. The terminal blocks 17a and 17b can be provided in a location nearer to the electronic component housed inside the first closed portion 13a and nearer to the electronic component housed inside the second closed portion 13b than in a case where a underfloor device is provided with terminal blocks positioned at both ends of the underfloor device in the forward/backward direction and extending in the widthwise direction. Thus, the cable arrangement between the terminal blocks 17a and 17b and the electronic components is simplified.

As described above, the underfloor device 1 according to Embodiment 1 can simplify the outfitting process while preventing an increase in the size of the underfloor device 1 by passing the first outfitting cable 21 and the second outfitting cable 22 through the opening 11 and the open portion 12, and respectively through the first connection port 14a of the first closed portion 13a and the second connection port 14b of the second closed portion 13b.

Embodiment 2

Figure 3:
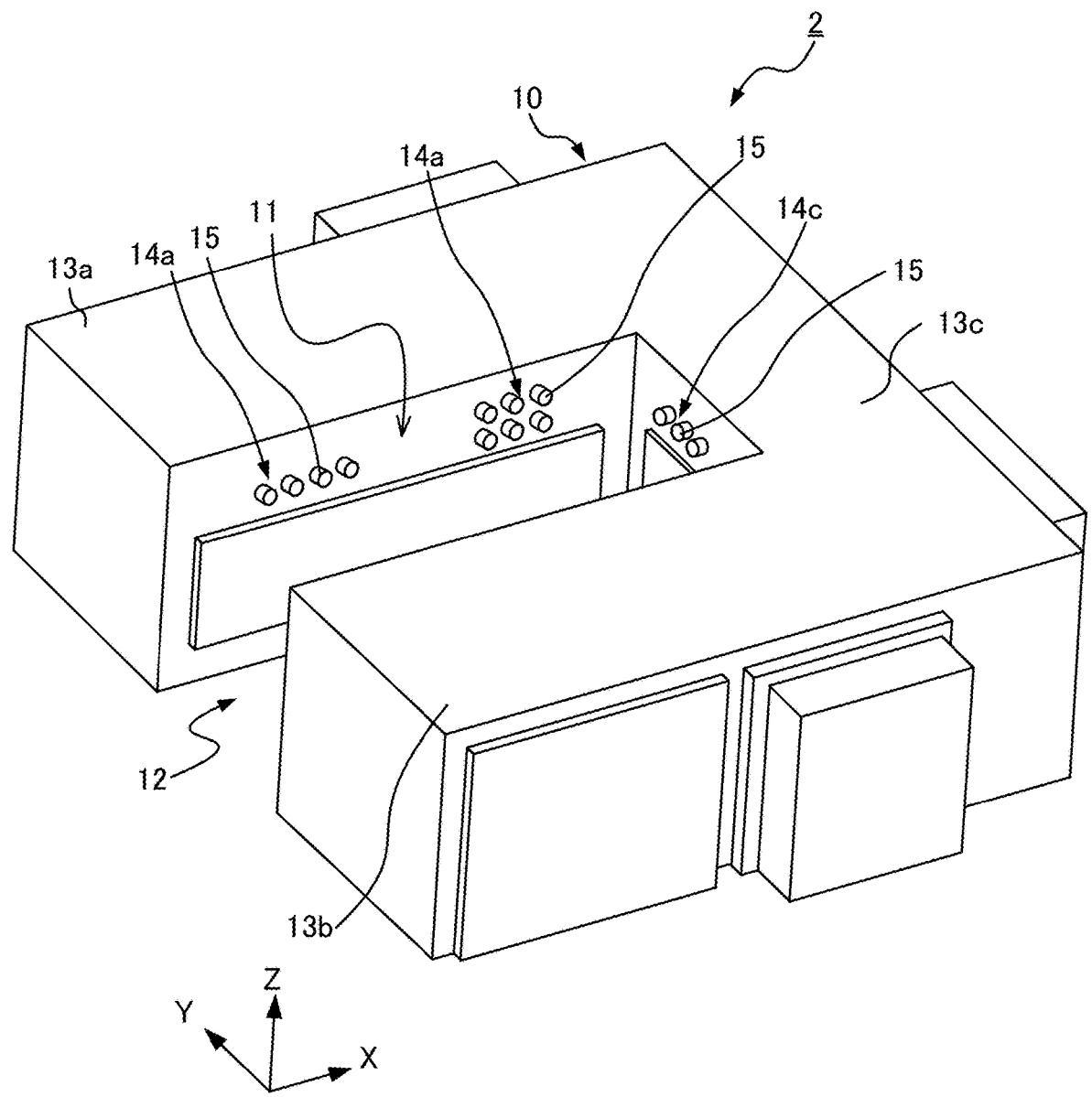
FIG. 3 is a perspective view of a railway vehicle underfloor device according to Embodiment 2 of the present disclosure.
Figure 4:
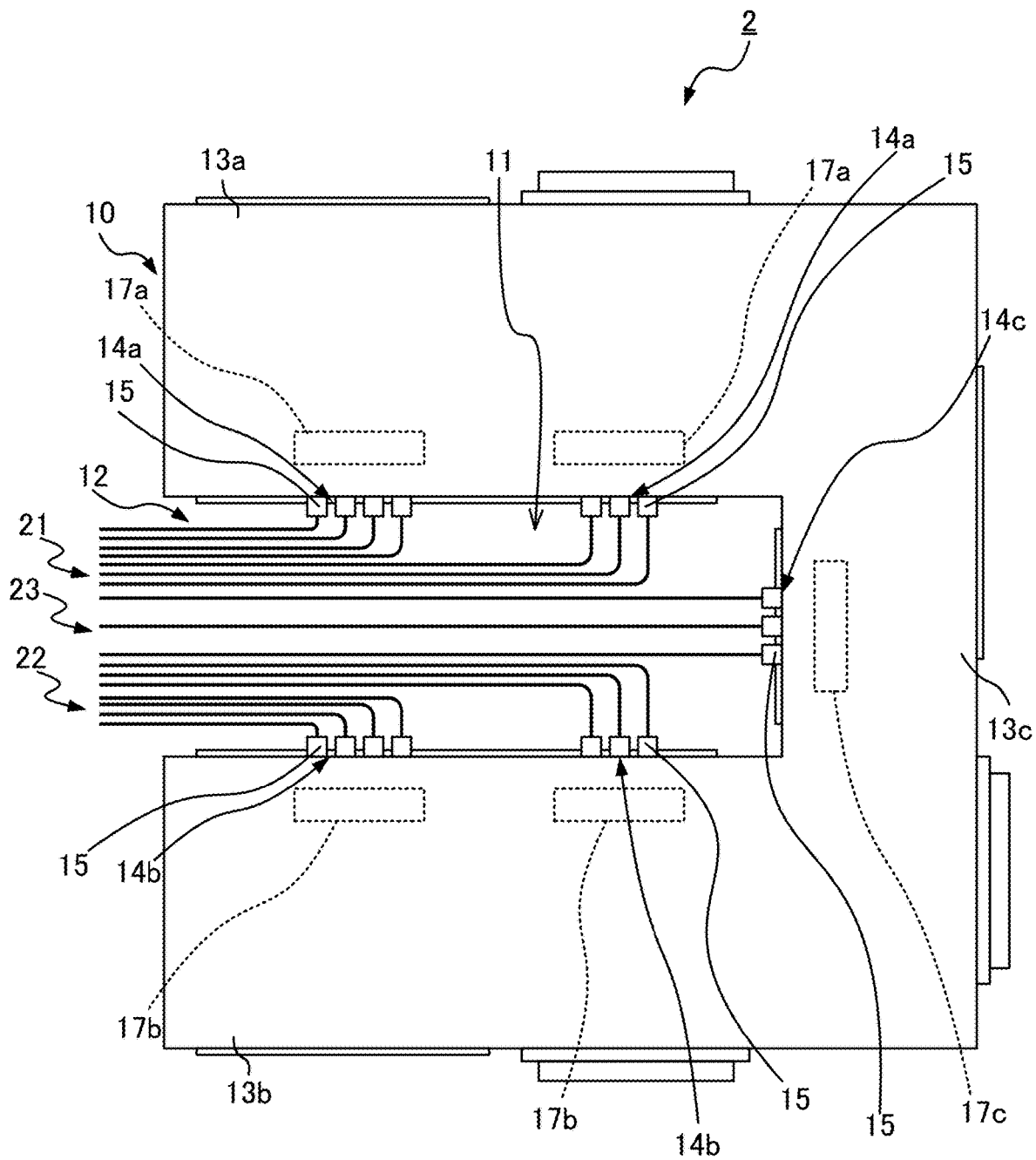
FIG. 4 is a plan view of the railway vehicle underfloor device according to Embodiment 2.

FIG. 3 is a perspective view of a railway vehicle underfloor device according to Embodiment 2 of the present disclosure. FIG. 4 is a plan view of the railway vehicle underfloor device according to Embodiment 2. An underfloor device 2 according to Embodiment 2 includes a third closed portion 13c in addition to the first closed portion 13a and the second closed portion 13b. The outer surface of the third closed portion 13c forms a portion of the housing 10. A portion of the outer surface of the third closed portion 13c is in contact with the open portion 12. Electronic components are housed inside the third closed portion 13c. On the portion of the outer surface of the third closed portion 13c in contact with the open portion 12, a third connection port 14c is provided through which a third outfitting cable 23 that electrically connects to a corresponding electronic component of electronic components housed inside is passed. Similar to the first closed portion 13a and the second closed portion 13b, air, moisture, dust, and the like from the exterior does not flow into the third closed portion 13c.

The first outfitting cable 21, the second outfitting cable 22, and the third outfitting cable 23 are passed through the opening 11 and the open portion 12, and respectively through the first connection port 14a, the second connection port 14b, and the third connection port 14c. Similar to the first connection port 14a and the second connection port 14b, the third connection port 14c includes a waterproof metal fitting 15. By including the waterproof metal fitting 15, air, moisture, dust, and the like from the exterior can be prevented from entering the third closed portion 13c via the third connection port 14c. By inserting the first outfitting cable 21, the second outfitting cable 22, and the third outfitting cable 23 through the waterproof metal fittings 15, the first outfitting cable 21, the second outfitting cable 22, and the third outfitting cable 23 are passed through the first connection port 14a, the second connection port 14b, and the third connection port 14c, respectively.

The third outfitting cable 23 electrically connects to a corresponding electronic component of electronic components housed inside the third closed portion 13c via a terminal block 17c housed inside the third closed portion 13c. The terminal block 17c is provided in parallel to the third connection port 14c inside the third closed portion 13c.

The third closed portion 13c is connected to the first closed portion 13a and the second closed portion 13b, and holds the first closed portion 13a and the second closed portion 13b, with a gap therebetween in the Y-axis direction. The inside of the first closed portion 13a, the second closed portion 13b, and the third closed portion 13c may communicate with one another but this is not necessary.

In the underfloor device 2, the opening 11 is provided on the top face of the housing 10 in the Z-axis direction and on a side of the housing 10 intersecting the X-axis, for example on the negative X-axis side of the sides that are perpendicular to the X-axis. By providing the opening 11 on a side intersecting the X-axis direction in addition to providing the opening 11 on the top face in the Z-axis direction, the outfitting process becomes easier.

Figure 5:
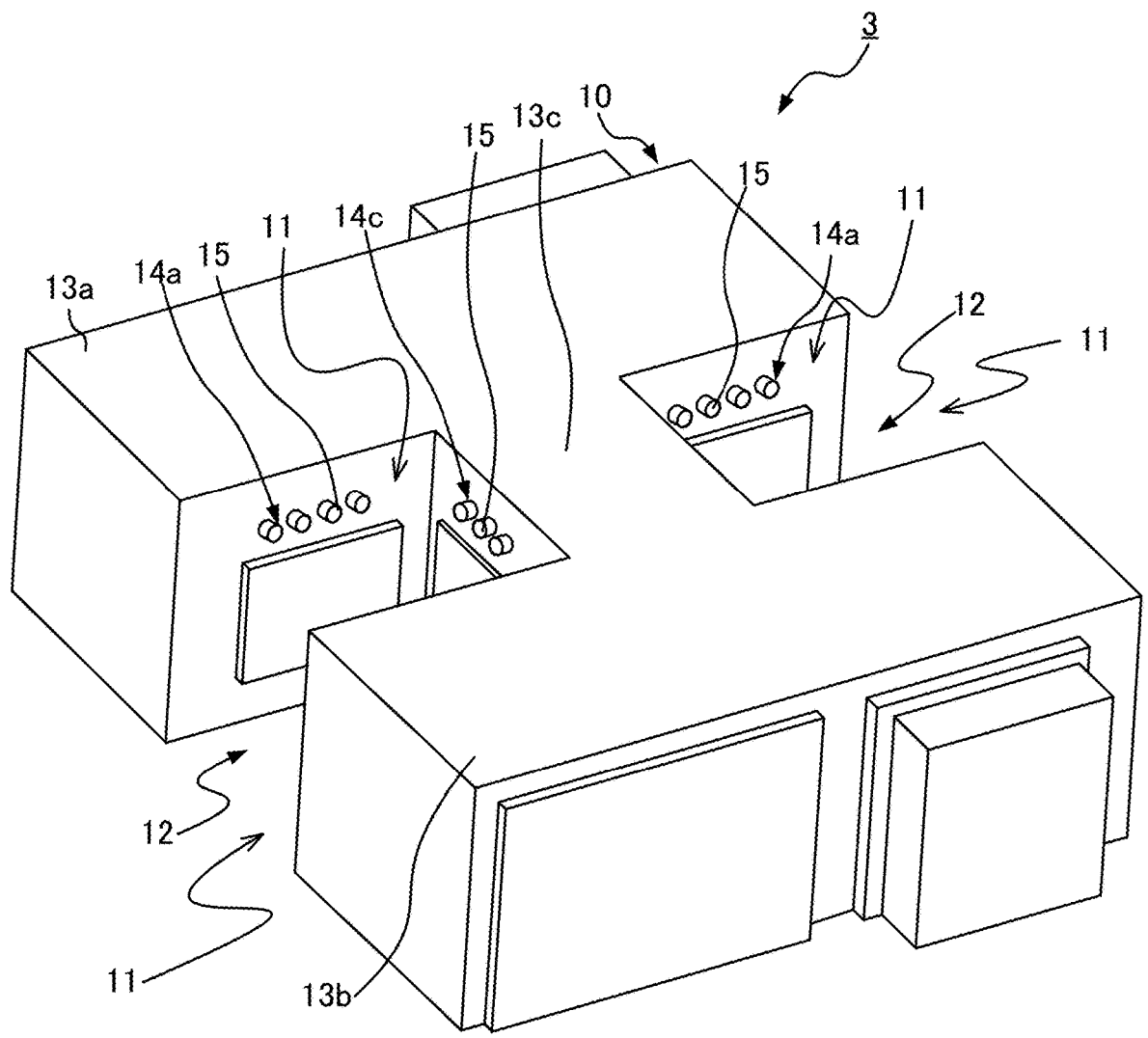
FIG. 5 is a perspective view of a modified example of the railway vehicle underfloor device according to Embodiment 2.
Figure 6:
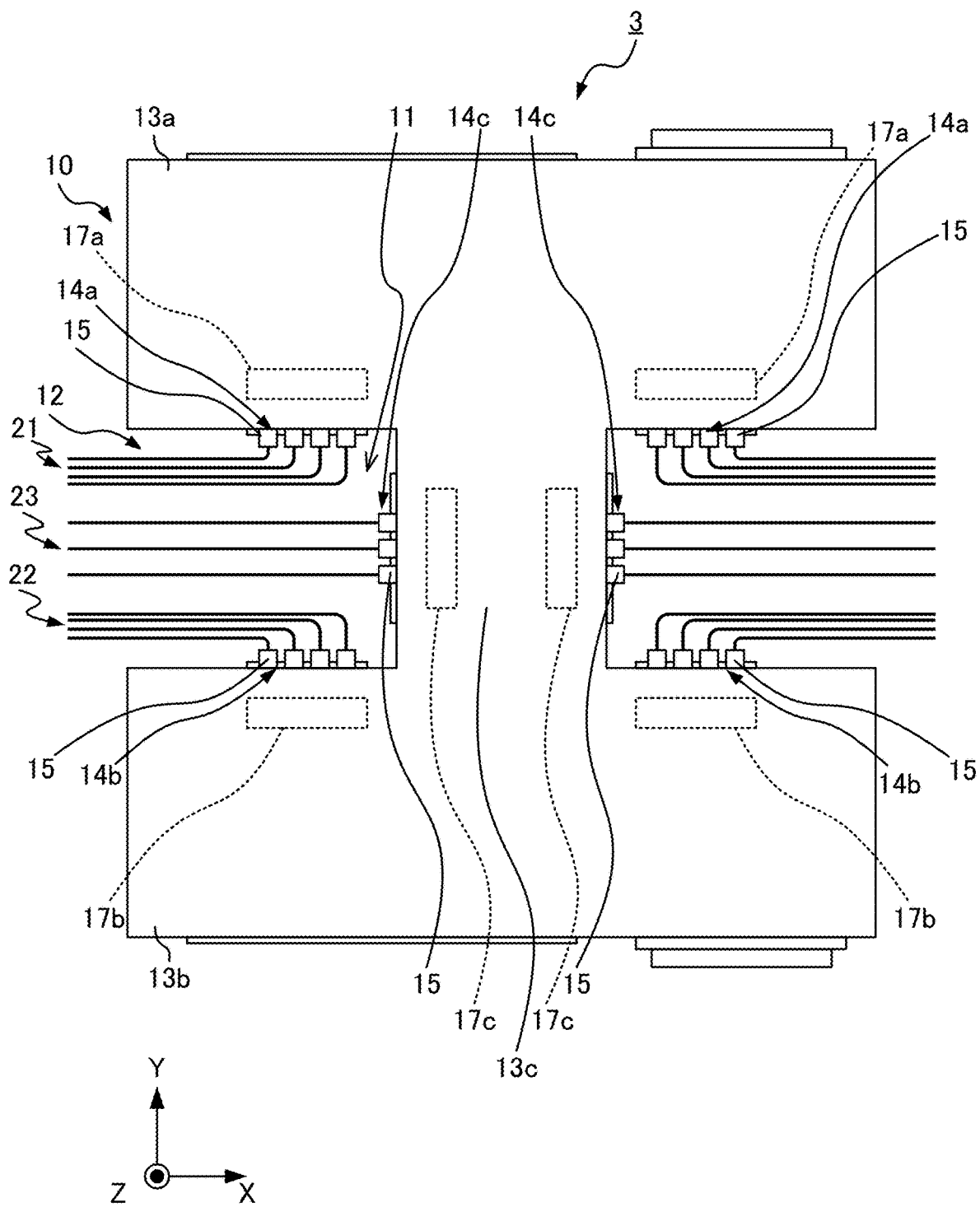
FIG. 6 is a plan view of the modified example of the railway vehicle underfloor device according to Embodiment 2.

The location of the third closed portion 13c is not limited to that in the foregoing example. FIG. 5 is a perspective view of a modified example of the railway vehicle underfloor device according to Embodiment 2. FIG. 6 is a plan view of the modified example of the railway vehicle underfloor device according to Embodiment 2. In the example in FIG. 5 and FIG. 6, the third closed portion 13c is provided in the center portion in an underfloor device 3 in the X-axis direction and in the Y-axis direction. In the underfloor device 3, the two openings 11 are provided on the top face of the housing 10 in the Z-axis direction. The opening 11 is also formed on each of two faces of the housing 10 opposing each other in the X-axis direction. In doing so, more openings 11 are provided, and thus the outfitting process becomes easier.

As described above, the underfloor devices 2 and 3 according to Embodiment 2 can simplify the outfitting process while preventing an increase in the size of the underfloor devices 2 and 3 by passing the first outfitting cable 21, the second outfitting cable 22, and the third outfitting cable 23 through the opening 11 and the open portion 12, and respectively through the first connection port 14a of the first closed portion 13a, the second connection port 14b of the second closed portion 13b, and the third connection port 14c of the third closed portion 13c.

Embodiments of the present disclosure are not limited to the foregoing embodiments. The foregoing examples may be combined as appropriate. The underfloor device 3 may further include the pair of the fixing members 16. The shape of the fixing member 16 is not limited to that in the foregoing example. An opening may be provided on the bottom face of the open portion 12 in the Z-axis direction and the bottom face may be covered by a removable cover, for example.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3 Underfloor device
10 Housing
11 Opening
12 Open portion
13a First closed portion
13b Second closed portion
13c Third closed portion
14a First connection port
14b Second connection port
14c Third connection port
15 Waterproof metal fitting
16 Fixing member
17a, 17b, 17c Terminal block
21 First outfitting cable
22 Second outfitting cable
23 Third outfitting cable

The invention claimed is:

1. A railway vehicle underfloor device to be mounted under a floor of a railway vehicle, the railway vehicle underfloor device comprising:
a housing provided with an opening on at least a top face of the housing in a vertical direction and an open portion therein, the open portion being a space extending in the vertical direction from the opening to a bottom face of the housing;
a first closed portion provided with an outer surface forming a portion of the housing, a portion of the outer surface being in contact with the open portion, the portion of the outer surface in contact with the open portion being provided with a first connection port through which a first outfitting cable that electrically connects to an electronic component to be housed inside the first closed portion is to be passed; and
a second closed portion provided with an outer surface forming a portion of the housing, a portion of the outer surface being in contact with the open portion, the portion of the outer surface in contact with the open portion being provided with a second connection port through which a second outfitting cable that electrically connects to an electronic component to be housed inside the second closed portion is to be passed,
wherein the first outfitting cable and the second outfitting cable are to be passed through the opening and the open portion, and respectively through the first connection port and the second connection port.

2. The railway vehicle underfloor device according to claim 1, wherein the first closed portion and the second closed portion are arranged across the open portion in a widthwise direction perpendicular to a travel direction of the railway vehicle and the vertical direction, such that the first connection port and the second connection port face each other.

3. The railway vehicle underfloor device according to claim 2, further comprising:
a pair of fixing members extending in the widthwise direction, the pair of fixing members holding the first closed portion and the second closed portion, with a gap therebetween in the widthwise direction.

4. The railway vehicle underfloor device according to claim 1, wherein
the first outfitting cable is to be connected to the electronic component to be housed in the first closed portion via a terminal block provided in parallel to the first connection port inside the first closed portion, and
the second outfitting cable is to be connected to the electronic component to be housed in the second closed portion via a terminal block provided in parallel to the second connection port inside the second closed portion.

5. The railway vehicle underfloor device according to claim 2, wherein
the first outfitting cable is to be connected to the electronic component to be housed in the first closed portion via a terminal block provided in parallel to the first connection port inside the first closed portion, and
the second outfitting cable is to be connected to the electronic component to be housed in the second closed portion via a terminal block provided in parallel to the second connection port inside the second closed portion.

6. The railway vehicle underfloor device according to claim 3, wherein
the first outfitting cable is to be connected to the electronic component to be housed in the first closed portion via a terminal block provided in parallel to the first connection port inside the first closed portion, and
the second outfitting cable is to be connected to the electronic component to be housed in the second closed portion via a terminal block provided in parallel to the second connection port inside the second closed portion.

7. The railway vehicle underfloor device according to claim 2, further comprising:
a third closed portion provided with an outer surface forming a portion of the housing, a portion of the outer surface being in contact with the open portion, the portion of the outer surface in contact with the open portion being provided with a third connection port through which a third outfitting cable that electrically connects to an electronic component to be housed inside the third closed portion is to be passed,
wherein the third closed portion is connected to the first closed portion and the second closed portion, and holds the first closed portion and the second closed portion, with a gap therebetween in the widthwise direction.

8. The railway vehicle underfloor device according to claim 3, further comprising:
a third closed portion provided with an outer surface forming a portion of the housing, a portion of the outer surface being in contact with the open portion, the portion of the outer surface in contact with the open portion being provided with a third connection port through which a third outfitting cable that electrically connects to an electronic component to be housed inside the third closed portion is to be passed,
wherein the third closed portion is connected to the first closed portion and the second closed portion, and holds the first closed portion and the second closed portion, with a gap therebetween in the widthwise direction.

9. The railway vehicle underfloor device according to claim 7, wherein
the first outfitting cable is to be connected to the electronic component to be housed in the first closed portion via a terminal block provided in parallel to the first connection port inside the first closed portion, and
the second outfitting cable is to be connected to the electronic component to be housed in the second closed portion via a terminal block provided in parallel to the second connection port inside the second closed portion, and
the third outfitting cable is to be connected to the electronic component to be housed in the third closed portion via a terminal block provided in parallel to the third connection port inside the third closed portion.

10. The railway vehicle underfloor device according to claim 8, wherein
the first outfitting cable is to be connected to the electronic component to be housed in the first closed portion via a terminal block provided in parallel to the first connection port inside the first closed portion, and
the second outfitting cable is to be connected to the electronic component to be housed in the second closed portion via a terminal block provided in parallel to the second connection port inside the second closed portion, and
the third outfitting cable is to be connected to the electronic component to be housed in the third closed portion via a terminal block provided in parallel to the third connection port inside the third closed portion.

11. The railway vehicle underfloor device according to claim 1, wherein the opening is provided on a face of the housing intersecting the travel direction and on the top face of the housing in the vertical direction.

12. The railway vehicle underfloor device according to claim 2, wherein the opening is provided on a face of the housing intersecting the travel direction and on the top face of the housing in the vertical direction.

13. The railway vehicle underfloor device according to claim 3, wherein the opening is provided on a face of the housing intersecting the travel direction and on the top face of the housing in the vertical direction.

14. The railway vehicle underfloor device according to claim 4, wherein the opening is provided on a face of the housing intersecting the travel direction and on the top face of the housing in the vertical direction.

15. The railway vehicle underfloor device according to claim 5, wherein the opening is provided on a face of the housing intersecting the travel direction and on the top face of the housing in the vertical direction.

16. The railway vehicle underfloor device according to claim 6, wherein the opening is provided on a face of the housing intersecting the travel direction and on the top face of the housing in the vertical direction.

17. The railway vehicle underfloor device according to claim 7, wherein the opening is provided on a face of the housing intersecting the travel direction and on the top face of the housing in the vertical direction.

18. The railway vehicle underfloor device according to claim 8, wherein the opening is provided on a face of the housing intersecting the travel direction and on the top face of the housing in the vertical direction.

19. The railway vehicle underfloor device according to claim 9, wherein the opening is provided on a face of the housing intersecting the travel direction and on the top face of the housing in the vertical direction.

20. The railway vehicle underfloor device according to claim 10, wherein the opening is provided on a face of the housing intersecting the travel direction and on the top face of the housing in the vertical direction.

* * * * *